United States Patent
Ross et al.

(10) Patent No.: US 10,430,163 B2
(45) Date of Patent: *Oct. 1, 2019

(54) TRANSPOSING IN A MATRIX-VECTOR PROCESSOR

(71) Applicant: Google LLC, Mountain View, CA (US)

(72) Inventors: Jonathan Ross, Menlo Park, CA (US); Robert David Nuckolls, Santa Clara, CA (US); Christopher Aaron Clark, Madison, WI (US); Chester Li, Cupertino, CA (US); Gregory Michael Thorson, Waunakee, WI (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/896,301

(22) Filed: Feb. 14, 2018

(65) Prior Publication Data
US 2018/0232209 A1 Aug. 16, 2018

Related U.S. Application Data

(63) Continuation of application No. 15/614,818, filed on Jun. 6, 2017, now Pat. No. 9,952,831.
(Continued)

(51) Int. Cl.
*G06F 7/78* (2006.01)
*G06F 7/76* (2006.01)
(Continued)

(52) U.S. Cl.
CPC .................. *G06F 7/78* (2013.01); *G06F 7/00* (2013.01); *G06F 7/768* (2013.01); *G11C 7/1012* (2013.01); *G11C 8/04* (2013.01); *G11C 19/28* (2013.01)

(58) Field of Classification Search
CPC .................................. G06F 7/78; G06F 17/16
See application file for complete search history.

(56) References Cited

U.S. PATENT DOCUMENTS

| 4,769,790 A | 9/1988 | Yamashita |
| 5,644,517 A | 7/1997 | Ho |
| (Continued) | | |

FOREIGN PATENT DOCUMENTS

| CN | 101427477 A | 5/2009 |
| CN | 101706760 | 5/2010 |
| (Continued) | | |

OTHER PUBLICATIONS

Hsu et al. "A 280 mV-to-1.1 V 256b Reconfigurable SIMD Vector Permutation Engine with 2-Deimensional Shuffle in 22nm Tri-Gate SMOS," IEEE Journal of Solid-state Physics, vol. 48, Jan. 2013, 10 pages.
(Continued)

*Primary Examiner* — Chuong D Ngo
(74) *Attorney, Agent, or Firm* — Fish & Richardson P.C.

(57) ABSTRACT

A circuit for transposing a matrix comprising reversal circuitry configured, for each of one or more diagonals of the matrix, to receive elements of the matrix in a first vector and generate a second vector that includes the elements of the matrix in an order that is a reverse of an order of the elements of the matrix in the first vector, and rotation circuitry configured, for each of the one or more diagonals of the matrix, to determine a number of positions by which to rotate the elements of the matrix in the second vector, receive the second vector of elements of the matrix, and generate a third vector that includes the elements of the matrix in the second vector in an order that is a rotation of the elements of the matrix in the second vector by the determined number of positions.

20 Claims, 8 Drawing Sheets

Related U.S. Application Data

(60) Provisional application No. 62/459,943, filed on Feb. 16, 2017.

(51) Int. Cl.
  *G11C 7/10* (2006.01)
  *G11C 8/04* (2006.01)
  *G11C 19/28* (2006.01)
  *G06F 7/00* (2006.01)

(56) References Cited

U.S. PATENT DOCUMENTS

| | | | |
|---|---|---|---|
| 5,805,476 A | 9/1998 | Kim et al. | |
| 6,353,633 B1 | 3/2002 | Her | |
| 6,816,593 B1 | 11/2004 | Tovey et al. | |
| 7,231,413 B2 | 6/2007 | Natsume | |
| 7,634,622 B1 | 12/2009 | Musoll et al. | |
| 7,742,063 B2 | 6/2010 | Leung et al. | |
| 9,201,899 B2 | 12/2015 | Nishimura et al. | |
| 9,952,831 B1 * | 4/2018 | Ross | G06F 7/768 |
| 2003/0084081 A1 | 5/2003 | Hanounik | |
| 2006/0190517 A1 | 8/2006 | Guerrero | |
| 2009/0031089 A1 | 1/2009 | Touminen | |
| 2011/0264723 A1 | 10/2011 | Yagain | |
| 2016/0012012 A1 | 1/2016 | Yen et al. | |

FOREIGN PATENT DOCUMENTS

| | | |
|---|---|---|
| CN | 103036529 A | 4/2013 |
| CN | 103389967 A | 11/2013 |
| CN | 104216866 A | 12/2014 |
| CN | 104298649 A | 1/2015 |
| TW | 420907 | 2/2001 |
| TW | 200939642 A | 9/2009 |
| TW | 201006137 A | 2/2010 |
| TW | 201640336 A | 11/2016 |
| WO | 2007135615 | 11/2007 |

OTHER PUBLICATIONS

Office Action issued in British Application No. GB1717818.7, dated Apr. 26, 2018, 11 pages.
Office Action issued in Chinese Application No. 201721588902.7, dated Apr. 23, 2018, 4 pages (with English Translation).
Extended European Search Report issued in European Application No. dated Jun. 4, 2018, 5 pages.
International Search Report and Written Opinion issued in International Application No. PCT/US2017/057681, dated Jan. 24, 2018, 15 pages.
Hanounik et al. "Linear-time matrix transpose algorithms using vector register file with diagonal registers," Proceedings of the 15$^{th}$ International Parallel and Distributed Processing Symposium, Apr. 2001, 8 pages.
Office Action issued in Taiwanese Application No. 106137285, dated Oct. 29, 2018, 9 pages.
Office Action issued in Chinese Application No. 201711183627.5, dated Mar. 13, 2019, 6 pages (English translation).

* cited by examiner

400

| Mux<br>Cycle | 0 | 1 | 2 | 3 |
|---|---|---|---|---|
| 0 | 0 |   |   |   |
| 1 | 1 | 0 |   |   |
| 2 | 2 | 1 | 0 |   |
| 3 | 3 | 2 | 1 | 0 |
| 4 |   | 3 | 2 | 1 |
| 5 |   |   | 3 | 2 |
| 6 |   |   |   | 3 |

450

US 10,430,163 B2

TRANSPOSING IN A MATRIX-VECTOR PROCESSOR

CROSS-REFERENCE TO RELATED APPLICATION

This application is a continuation of U.S. application Ser. No. 15/614,818, filed Jun. 6, 2017, which claims the benefit of U.S. Provisional Application No. 62/459,943, filed Feb. 16, 2017, the contents of each are hereby incorporated by reference.

BACKGROUND

This specification relates to computing matrix transposes in hardware.

A matrix transpose is a computation by which a matrix is reflected over its main diagonal, which runs from the top left (0,0) position to the bottom right (n,n) position, where n is the smaller of the matrix's dimensions. The effect is that rows of an input matrix are output as the columns of a transposed matrix. That is, for the $i^{th}$ row and $j^{th}$ column element of an input matrix A, $[A^T]_{ij}=[A]_{ji}$.

SUMMARY

In general, this specification describes a special-purpose hardware circuit that computes matrix transposes.

In general, one innovative aspect of the subject matter described in this specification can be embodied in a circuit for transposing a matrix, the circuit comprising reversal circuitry configured to receive, for each of one or more diagonals of the matrix, elements of the diagonal of the matrix in a first vector, and generate, for each of the one or more diagonals of the matrix, a second vector that includes the elements of the diagonal of the matrix in an order that is a reverse of an order of the elements of the diagonal of the matrix in the first vector. The circuit comprises rotation circuitry configured to determine, for each of the one or more diagonals of the matrix, a number of positions by which to rotate the elements of the diagonal of the matrix in the second vector, receive, for each of the one or more diagonals of the matrix, the second vector of elements of the diagonal of the matrix, and generate, for each of the one or more diagonals of the matrix, a third vector that includes the elements of the diagonal of the matrix in the second vector in an order that is a rotation of the elements of the diagonal of the matrix in the second vector by the determined number of positions.

Implementations can include one or more of the following features. The circuit comprises counting circuitry configured to output, to the rotation circuitry and for each of the one or more diagonals of the matrix, a number of positions by which to rotate the elements of the diagonal of the matrix in the second vector; the counting circuitry is configured to output, as the number of positions by which to rotate the elements of the diagonal of the matrix in the second vector and for each of the one or more diagonals of the matrix, a value, wherein an initial value output by the counting circuitry is equivalent to N−1, where N is equivalent to the width of the rotation circuitry; the counting circuitry is configured to decrement the value output by the counting circuitry for each of the one or more diagonals of the matrix, and after the value output by the counting circuitry is zero for one of the one or more diagonals of the matrix, reset the value to the initial value.

Implementations may each optionally include one or more of the following features. The matrix is a submatrix of a second matrix; the circuit comprises staggered memory read circuitry configured to access, for each of the one or more diagonals of the matrix, elements of the diagonal of the matrix, and output, to the reversal circuitry, the elements of the diagonal of the matrix as the first vector; the staggered memory read circuitry comprises M multiplexors, where M is equivalent to the width of the reversal circuitry, and wherein each multiplexor is configured to output one of a plurality of elements of a column of a matrix; the staggered memory read circuitry is configured to receive a control signal that specifies, for each of the M multiplexors, an input of the multiplexor to provide as an output of the multiplexor; each of the M multiplexors is an N-to-1 multiplexor, where N is the number of elements capable of being received by the rotation circuitry; the staggered memory read circuit is configured to receive a first control signal that specifies, for a first one or more of the M multiplexors, an input of the multiplexor to provide as an output of the multiplexor, and receive a second control signal that specifies, for a second one or more of the M multiplexors, an input of the multiplexor to provide as an output of the multiplexor.

Implementations may each optionally include one or more of the following features. The circuit comprises a staggered memory write circuit configured to write, for each of the one or more diagonals of the matrix, the elements of the diagonal of the matrix in the third vector to memory as a diagonal of a transpose output matrix; the matrix comprises two or more matrices stored in memory as a single matrix; the rotation circuitry is configured to perform right rotation of the elements of the diagonal of the matrix in the second vector by the determined number of positions to generate the third vector; the matrix is stored at a static random-access memory accessible by the circuit; for each of the one or more diagonals of the matrix, the elements of the diagonal of the matrix in the third vector are stored in a static random-access memory as a diagonal of a transpose output matrix.

Implementations may each optionally include one or more of the following features. The circuit comprises second rotation circuitry configured to determine, for each of one or more diagonals of a second matrix, a number of positions by which to rotate elements of the diagonal of the second matrix, receive, for each of the one or more diagonals of the second matrix, a fourth vector that includes elements of the diagonal of the second matrix, and generate, for each of the one or more diagonals of the second matrix, a fifth vector that includes the elements of the diagonal of the second matrix in the fourth vector in an order that is a rotation of the elements of the diagonal of the second matrix in the fourth vector by the determined number of positions; the circuit comprises second counting circuitry configured to output, to the second rotation circuitry and for each of the one or more diagonals of the second matrix, a number of positions by which to rotate the elements of the diagonal of the second matrix in the fourth vector.

Another innovative aspect of the subject matter described in this specification can be embodied in a circuit for transposing an input vector, the circuit comprising reversal circuitry configured to receive, for each of one or more elements of the input vector, a first vector that includes the element of the input vector, and generate, for each of the one or more elements of the input vector, a second vector that includes the elements of the first vector in an order that is a reverse of the order of the elements in the first vector. The circuit comprises rotation circuitry configured to determine, for each of the one or more elements of the input vector, a number of positions by which to rotate the elements in the second vector, receive, for each of the one or more elements of the input vector, the second vector of elements, and generate, for each of the one or more elements of the input vector, a third vector that includes the elements of the second vector in an order that is a rotation of the order of the elements in the second vector by the determined number of positions.

Particular embodiments of the subject matter described in this application can be implemented so as to realize one or more of the following advantages. A transpose output matrix corresponding to a transpose of an input matrix can be generated in hardware by a special-purpose hardware circuit. By generating the appropriate output using the special-purpose hardware circuit, a matrix transpose computation can be performed without passing data back to a host computer, i.e., without performing at least a part of the computation off-chip or in software. As a result, processing delays resulting from performing the transpose computation off-chip or in software, where the computation can be an expensive one requiring a significant number of general processor (e.g., GPU or CPU) cycles to perform, are avoided.

Using a hardware circuit specially designed to perform matrix transpose computations also allows for more efficient processing compared to a system that performs matrix transpose computations in a general matrix processing hardware circuit, e.g., one that is also configured to perform matrix convolutions or other operations. Implementing matrix transpose computations on a dedicated hardware circuit permits a design that efficiently handles matrix transpose computations without concern for other matrix operation capabilities or efficiencies, and reserves other matrix processing hardware circuits for performing those other matrix operations, thereby increasing the efficiency of matrix computations in hardware generally.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

A matrix transpose computation that produces an output matrix in which the rows of an input matrix are rewritten as the columns of the output matrix, i.e., for the $i^{th}$ row and $j^{th}$ column element of an input matrix A, $[A^T]_{ij}=[A]_{ji}$. Therefore, transposing an input matrix effectively reflects an input matrix over its main diagonal, which runs from the (0,0) position of the matrix to the (n−1,n−1) position of the matrix, where n is the smaller of the dimensions of the matrix.

Practical applications for these and other matrix transpose computations are many and varied. For example, a matrix transpose may be computed when training a neural network. In such an application, to backpropagate gradients when training a neural network, a transpose of a weight matrix used in implementing a layer of the neural network may be computed. In other instances, matrix transposes may be performed on an inference computed by a neural network, or may be performed on matrix or vector output of a particular layer of a neural network.

The matrix transpose computation is used frequently in applications of linear algebra. For example, a matrix transpose computation is used to compute the dot product of two input matrices A and B, such that $A^T B = A \cdot B$. The dot product may be used, for example, to compute angles and sizes of matrices, since $A \cdot B = \|A\| \|B\| \cos \theta$. Dot products may also be used in computing linear functions on vectors, where a linear function taking a vector A as an argument can be performed by computing dot products between the vector A and a collection of vectors representing the linear function.

Matrix transpose computations may also be performed in image processing applications, such as to perform image flip or rotate operations. A digital image represented as a matrix may be manipulated using transpose computations to generate rotations or mirror-images of the digital image. In signal processing and other fields, fast Fourier transform (FFT) algorithms are implemented using matrix transposes, for instance, when performing multi-dimension parallel FFT algorithms. Social network or other network analysis may also utilize matrix transpose computations to determine the sources of relationships between nodes in the network, or to determine patterns of relationships between nodes in the network. Statistical programming, geographic information systems, and other applications also frequently utilize matrix transpose computations.

This specification describes special-purpose hardware circuitry that processes an input matrix or vector to generate a transpose output matrix, i.e., a transpose of the input matrix or vector.

Figure 1:
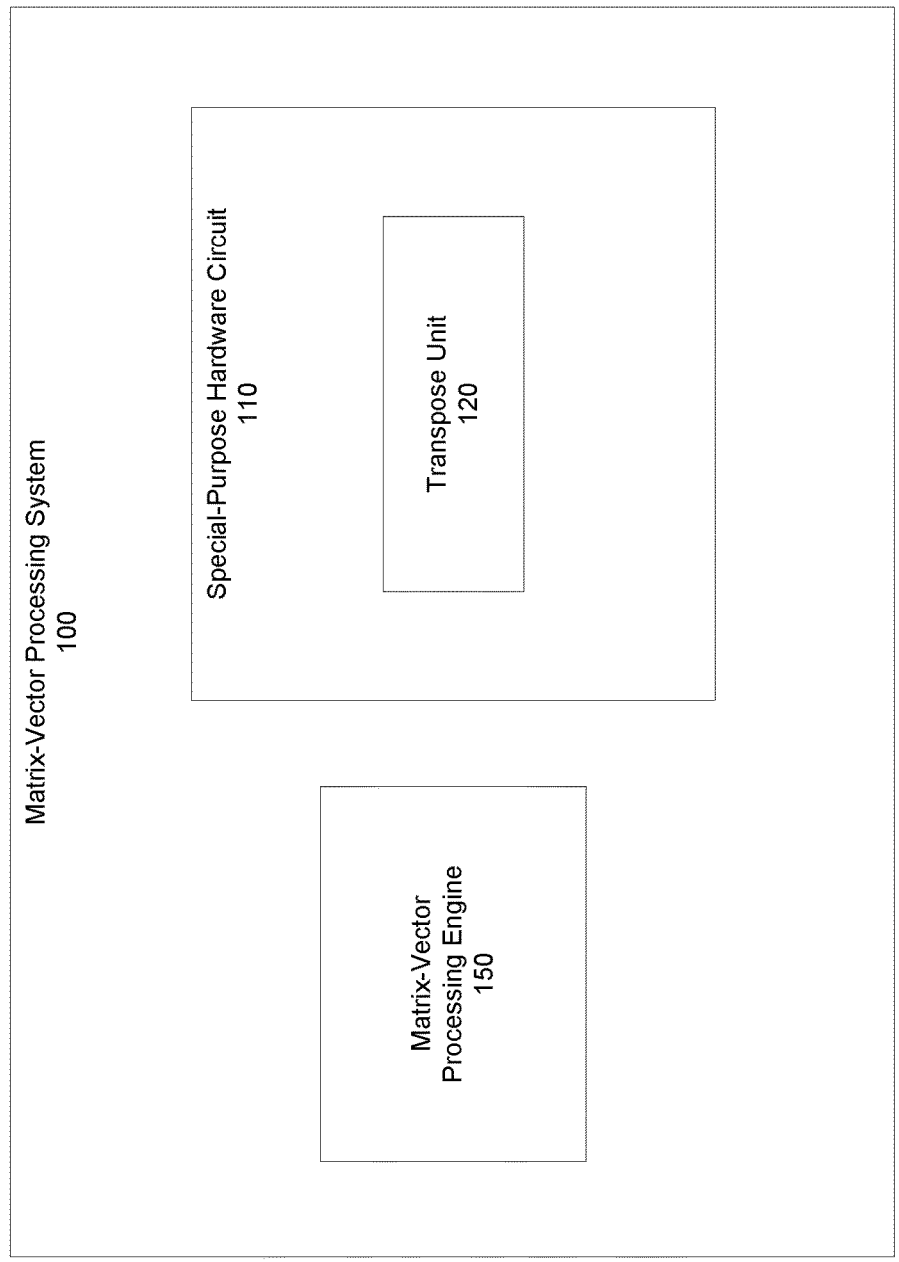
FIG. 1 shows an example matrix-vector processing system.

FIG. 1 shows an example matrix-vector processing system 100. The matrix-vector processing system 100 is an example of a system implemented as one or more computers in one or more locations in which the systems, components, and techniques described below can be implemented.

The matrix-vector processing system 100 is a system that performs matrix or vector computations using a special-purpose hardware circuit 110. The special-purpose hardware circuit 110 is an integrated circuit for performing matrix or vector computations that includes a transpose unit 120 configured to compute matrix transposes in hardware. An example special-purpose hardware circuit 110 is described in more detail with reference to FIG. 2.

The matrix-vector processing system 100 receives requests to perform matrix or vector computations on the special-purpose hardware circuit 110, controls the special-purpose hardware circuit 110 to perform the matrix or vector computations, and outputs results of the matrix or vector computations generated by the special-purpose hardware circuit 110. For example, the matrix-vector processing system 100 may receive a request to compute a transpose of an input matrix, implement the matrix transpose computation on the special-purpose hardware circuit 110, and output a resulting transpose matrix in response to the request. The special-purpose hardware circuit 110 may be capable of performing additional computations in addition to matrix transpose.

To implement matrix or vector computations on the special-purpose hardware circuit 110, the matrix-vector processing system 100 includes a matrix-vector processing engine 150. The matrix-vector processing engine 150 may be implemented as one or more computer programs on one or more computers in one or more physical locations.

The matrix-vector processing engine 150 can generate instructions, provide control signals, or direct data to control the special-purpose hardware circuit 110 to perform matrix or vector computations in response to a request. For example, the matrix-vector processing system 100 may receive a request to perform a matrix or vector function, and the matrix-vector processing engine 150 can determine specific instructions or control signals for computing the function, or can determine how to direct data, e.g., corresponding to input matrices or vectors, for the computation.

Once the matrix-vector processing engine 150 determines how to implement computations corresponding to a matrix or vector computation request, the matrix-vector processing engine 150 controls the special-purpose hardware circuit 110 to perform the computations. For example, the matrix-vector processing engine 150 may direct data for performing the matrix or vector computations, such as input matrices or vectors, to the special-purpose hardware circuit 110. The matrix-vector processing engine 150 may also transmit instructions or control signals to the special-purpose hardware circuit 110 to control the special-purpose hardware circuit 110 to perform the appropriate computations on the data received by it from the matrix-vector processing engine 150.

For example, the matrix-vector processing system 100 can receive a request to compute a matrix or vector function. The requested function may be relatively simple, e.g., a request to compute a dot product, or a more complex function, e.g., one for backpropagating gradients to train a neural network or for performing a multi-dimension parallel FFT, that involves computing a transpose of a matrix. The request may also identify or include one or more matrices or vectors for computing the function, i.e., one or more arguments on which to apply the function. The matrix-vector processing engine 150 can receive the request and can generate control signals or instructions to compute the function for the input matrices or vectors. The matrix-vector processing engine 150 may furthermore direct the input matrices or vectors to the special-purpose hardware circuit 110.

For example, to compute a matrix transpose, the matrix-vector processing engine 150 may provide an input matrix or vector, or matrix or vector generated as an output of a preceding computation, on which to perform the transpose to the special-purpose hardware circuit 110, such that the input matrix or vector is provided to the transpose unit 120. The matrix-vector processing engine 150 may also provide to the special-purpose hardware circuit 110 a control signal for initiating the transpose computation on the transpose unit 120. The transpose unit 120 may receive the input matrix or vector and the control signal for initiating the transpose computation. The transpose unit 120 can perform the transpose computation in response to receiving the control signal, and can output a matrix or vector that is the transpose of the received matrix or vector. The transpose matrix output by the transpose unit 120 may be used in other computations by the special-purpose hardware circuit 110 for computing the requested function. The special-purpose hardware circuit 110 may provide an output of the requested function, which the matrix-vector processing system 100 can return in response to the request.

Figure 2:
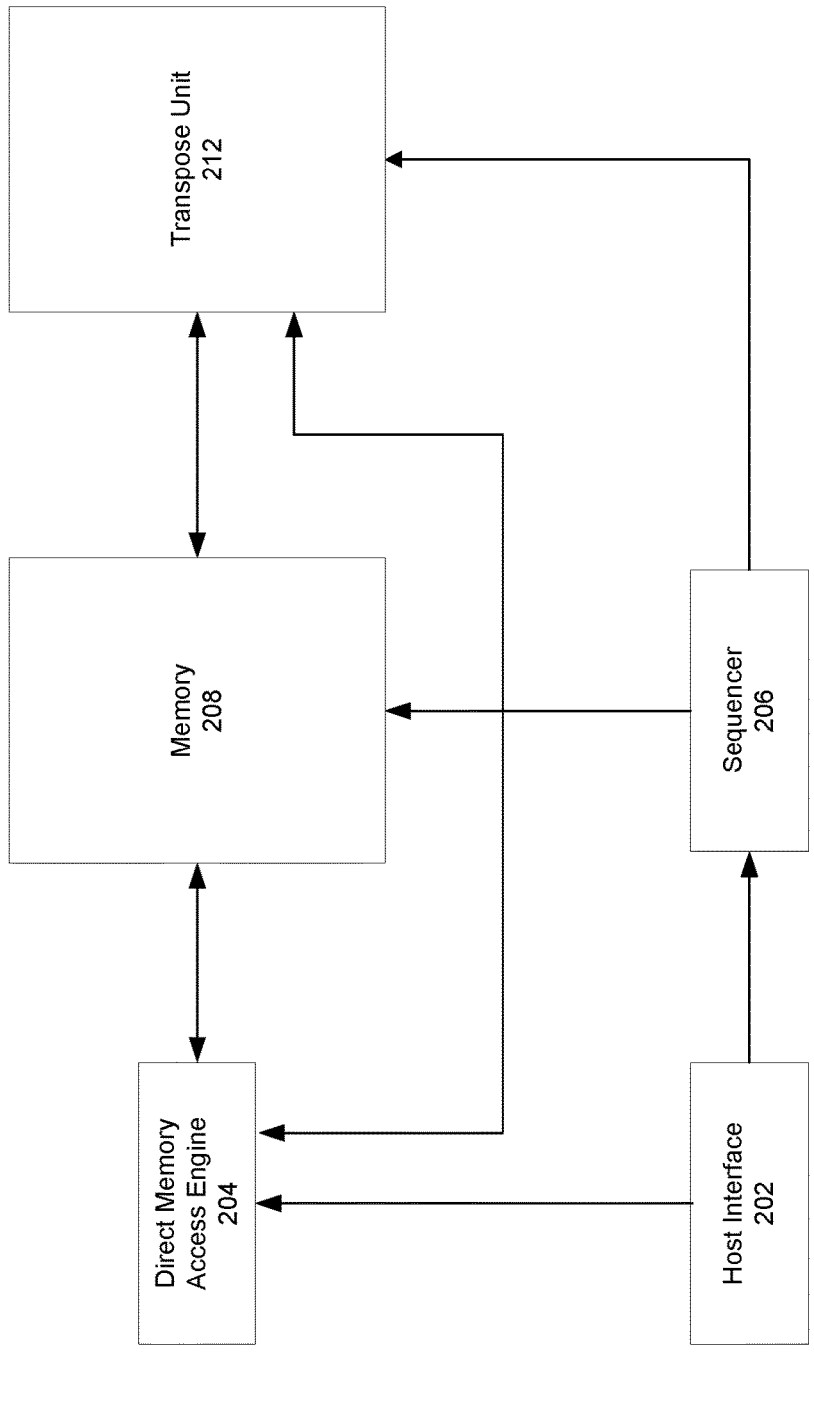
FIG. 2 shows an example matrix-vector processing system including a transpose unit.

FIG. 2 shows an example special-purpose hardware circuit 200 for computing matrix transposes. In some implementations, the circuit 200 may include additional components, not shown, for performing other matrix or vector computations. Additional components for performing other matrix or vector computations may also utilize one or more of the components shown in FIG. 2.

The circuit 200 includes a host interface 202. The host interface 202 can receive control signals, instructions, or arguments for a transpose computation. The arguments can include, for example, a matrix or vector on which to perform a transpose computation. Instructions received by the host interface 202 can include instructions indicating where to store the received arguments so that the circuit 200 may compute the matrix transpose. A control signal received by the host interface may be a signal for initiating the transpose computation.

In some implementations, the host interface 202 can provide instructions to the sequencer 206, which converts the instructions into low-level control signals that control the circuit 200 to perform the transpose computation. For example, the control signals generated by the sequencer 206 may regulate dataflow in the circuit 200, e.g., where an input matrix or vector should be stored or how that data should otherwise be directed through the circuit 200. The sequencer 206 may receive an instruction to initiate a transpose computation on the circuit 200, and may generate a control signal for controlling a transpose unit 212 to initiate a transpose computation.

The sequencer 206 can send the control signals to memory 208 and the transpose unit 212. In some implementations, the sequencer 206 also sends control signals to a direct memory access engine 204. In some implementations, the sequencer 206 is a processor that generates control signals. The sequencer 206 can use timing of the control signals to, at appropriate times, send the control signals to the appropriate components of the circuit 200. In some instances, the sequencer 206 may receive control signals from the host interface 202 that are passed in externally from the circuit 200, e.g., from the vector-matrix processing engine 150 of FIG. 1, such that the sequencer 206 is not required to generate control signals. In such instances, the sequencer 206 may send the received control signals to the components of the circuit 200 at appropriate times. Moreover, where the circuit 200 is provided control signals, the sequencer 206 may be an optional component of the circuit 200, i.e., such that a component external to the circuit 200, e.g., the matrix-vector processing engine 150, may provide the control signals at the appropriate times to control the circuit 200 to perform a matrix transpose operation.

The host interface 202 can send an argument, e.g., an input matrix or vector, to the direct memory access engine 204. The direct memory access engine 204 can store the argument at the memory 208.

The memory 208 may be a memory buffer, e.g., a unified buffer, or may be a dynamic memory, e.g., a static random-access memory (SRAM). The memory 208 may be located on or off of the circuit 200. It can be used to store an argument input to the circuit 200, such as a matrix or vector. The memory 208 may also store outputs of the transpose unit 212, i.e., a transpose output matrix or vector. The direct memory access engine 204 may, in some implementations, read from the memory 208. For example, the direct memory access engine 204 may read from the memory 208 to return, from the circuit 200, a result of performing a matrix transpose.

The memory 208 can send an argument to the transpose unit 212 for transposing. For example, after the direct memory access engine 204 stores an input matrix or vector in the memory 208, the input matrix or vector may be provided or made accessible to the transpose unit 212, so that the transpose unit 212 may compute a transpose of the input matrix or vector.

The transpose unit 212 is a circuit for computing matrix or vector transposes. In some implementations, the transpose unit 212 is designed such that the transpose unit may be triggered to compute a matrix transpose based on receiving an argument and a control signal for initiating the transpose computation. That is, the transpose unit 212 may be configured to require only a single control signal to perform an entire transpose process on an argument and to generate a transpose of the argument, i.e., a transpose output matrix or vector.

In such an implementation, once a transpose computation is initiated, the transpose unit 212 may perform an entire transpose computation in a fixed manner, i.e., such that the transpose unit 212 will perform the transpose computation in the same manner regardless of the argument provided to the transpose unit 212. Thus, the transpose unit 212 may be configured to perform the same computations regardless of whether an input matrix is a 64×64 element matrix, a 128×128 element matrix, etc. The transpose unit 212 stores outputs, i.e., transpose output matrices or vectors, at the memory 208.

Generally, to compute a matrix or vector transpose, the transpose unit 212 performs a staggered memory read of an argument that is stored in the memory 208. When the argument is a matrix, the staggered memory read enables the transpose unit 212 to obtain, for each diagonal of the matrix, a vector of elements corresponding to the diagonal of the matrix in a register. The transpose unit 212 reverses the order of the elements of the diagonal of the matrix stored in the register to generate and store a second vector of the elements of the diagonal of the matrix, e.g., in the same register or in a second register. The elements of the second vector are shifted by a determined number of positions to obtain a third vector including the elements of the diagonal of the matrix, which is then stored, e.g., in the same register or in a third register. A staggered memory write is performed to place the elements in the third vector, e.g., in the third register, in appropriate memory locations. The process is repeated for each diagonal of the matrix to obtain a transpose output matrix that is stored in memory as the transpose of the matrix.

Figure 3:
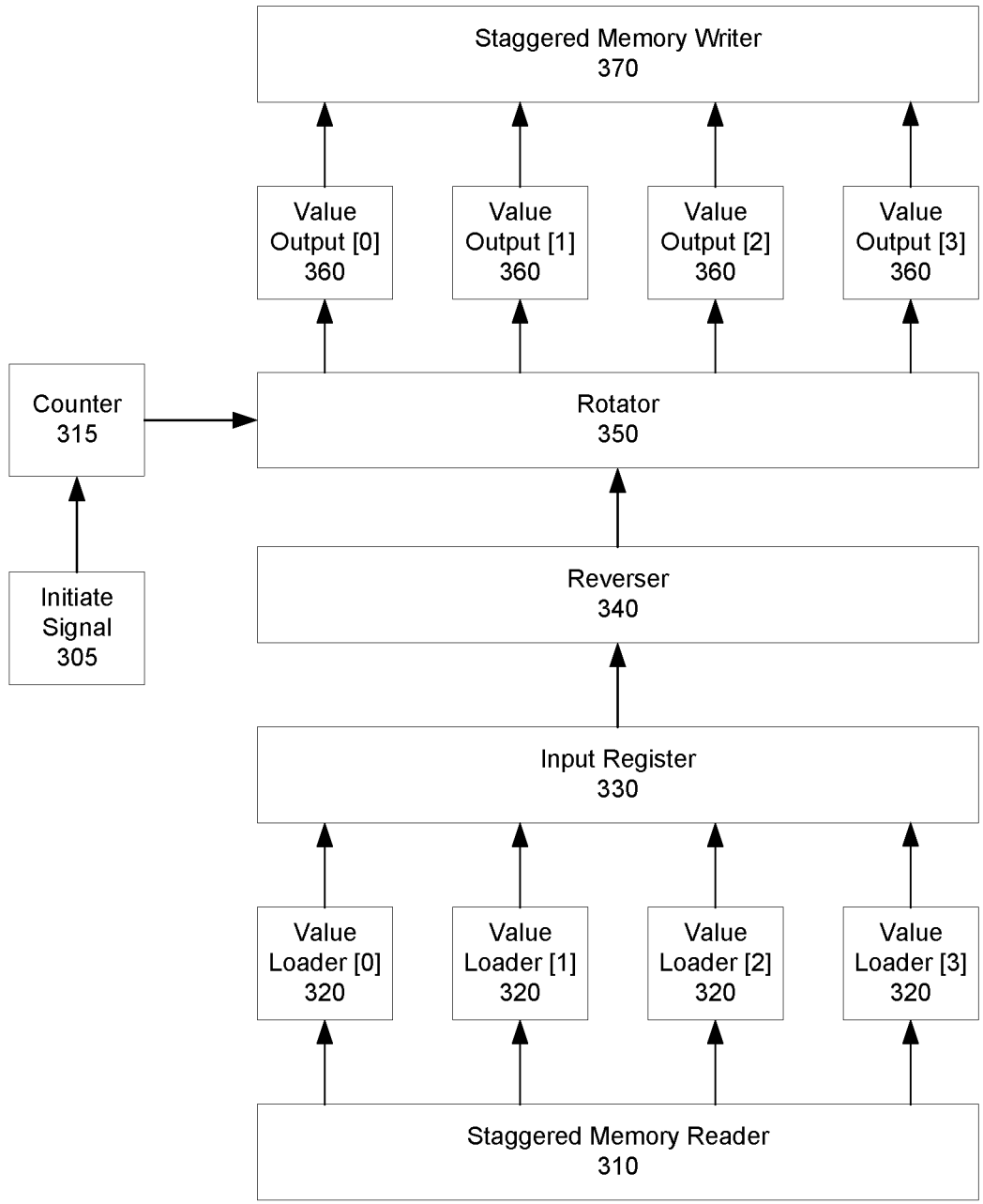
FIG. 3 shows an example architecture of a transpose unit in a matrix-vector processing system.

As discussed above, these same operations are performed when the argument is a vector. Thus, when the argument is a vector, the staggered memory read enables the transpose unit 212 to obtain a single element of the vector in a register for each iteration of the process. The element in the register for each iteration is manipulated according to the above process to obtain a transpose of the vector. Where the transpose computation is performed on a vector, the transpose output vector will also be a vector, however, an input column vector will have been converted to a row vector, and a row vector to a column vector. FIG. 3 shows an example architecture of a transpose unit 300. In the illustrated example, a staggered memory reader 310 accesses an input matrix or vector, and outputs elements corresponding to a diagonal of the input matrix. The staggered memory reader can process each diagonal of the input matrix starting with the (0,0) diagonal of the input matrix. Each diagonal of the input matrix is a diagonal line of elements extending from the lower-left to top-right of the input matrix, i.e., the diagonal line of elements extending from the (n−1,0) element of the input matrix to the (0,n−1) element of the input matrix. Operation of the staggered memory reader 310 is discussed in further detail with respect to FIG. 4.

The elements of the diagonal of the input matrix output by the staggered memory reader 310 are received by value loaders 320, where each value loader 320 corresponds to a different column of the data, i.e., the input matrix, accessed by the staggered memory reader 310. In the example transpose unit 300 shown in FIG. 3, the transpose unit architecture 300 is capable of computing transposes up to 4×4, however, the same techniques may be expanded for any size transpose unit. Thus, when transposing a 4×4 input matrix, each of the value loaders 320 corresponds to a column of the input matrix. If transposing a matrix smaller than 4×4 using the 4×4 transpose unit 300, the values provided to the upper value loaders can be discarded or ignored. For example, if a 3×3 input matrix is read by the staggered memory reader 310, values output to value loader [3] can be ignored or discarded, as they do not correspond to elements of the input matrix.

The value loaders 320 transmit the received elements to an input register 330, where the input register stores the elements as a first vector. For the example transpose unit 300, the input register may be a 1×4 register of elements, corresponding to the dimensions of the maximum-sized input matrix that the transpose unit 300 can process, i.e., 4×4. Thus, an element received by value loader [0] may be stored in a (0,0) element of the input register 330, an element received by value loader [1] may be stored in a (0,1) element of the input register 330, and so forth. In some implementations, if the matrix input to the transpose unit 300 is smaller than the maximum input matrix size for the transpose unit 300, the value loaders 320 may not send the values that do not correspond to elements of the input matrix to the input register 330. For example, if a 3×3 matrix is input to the 4×4 transpose unit 300, value loader [3] may not send a value to the input register 330.

A reverser 340 receives elements stored in the input register 330 and reverses the order of the elements to generate a second vector of elements. In some implementations, the reverser 340 receives the first vector of elements stored at the input register 330, and reverses the order of the elements of the first vector to generate a second vector. For example, the elements of the input register 330 may be sent to the reverser 340, and the reverser 340 may write the elements to another register in a reverse order from which they were stored in the input register 330.

For the transpose unit 300 illustrated, reversing the order of the elements may comprise storing an element in the [0] position of the input register 330 in a [3] position of the register of the reverser 340, storing an element in the [1] position of the input register 330 in a [2] position of the register of the reverser 340, storing an element in the [2] position of the input register 330 in a [1] position of the register of the reverser 340, and storing an element in the [3] position of the input register 330 in a [0] position of the register of the reverser 340. In some implementations, the reverser 340 may reverse the order of the elements by having write lines connecting the respective positions of the input register 330 and the register of the reverser 340 as specified above, such that the order of elements in the input register 330 will be written into the proper positions of the register of the reverser 340. Because the elements received from the input register 330 correspond to a diagonal of the input matrix, reversing the ordering of the elements of the diagonal of the input matrix effectively results in a reflection of those elements across the main diagonal of the input matrix.

A rotator 350 receives the elements stored in the register of the reverser 340 and rotates the ordering of the elements to generate a third vector of elements. In some implementations, the rotator 350 receives the second vector of elements stored at the register of the reverser 340, and right-rotates, i.e., right bit-wise shifts, the elements to generate a third vector of elements. For example, the elements stored at the register of the reverser 340 may be sent to the rotator 350, and the rotator 350 may write the elements to another register in an order reflecting the rotation of the elements. To accomplish rotation, the rotator 350 may feature a barrel shift circuit that is capable of bit-wise shifting the elements in the register of the reverser 340 by a specified number of bits using combinatorial logic, i.e., without using sequential logic.

The number of positions by which the elements received by the rotator 350 are rotated is determined based on a counter 315 that is in communication with the rotator 350. The counter 315 is set in response to an initiate signal 305. For example, the initiate signal 305 may be a single control signal that initiates operation of the transpose unit 300, including setting the counter 315. In some implementations, the initiate signal 305 is a control signal provided by the sequencer 206 of FIG. 2, where the control signal may have been provided to the sequencer 206, e.g., by the matrix-vector processing engine 150 or may have been generated by the sequencer 206 based on instructions received by the host interface 202.

In implementations where the rotator 350 performs right-rotation, the initiate signal 305 causes the counter 315 to be set to a value of N-1, where N is equivalent to a number of elements that the rotator 350 can receive, i.e., equivalent to the width of the rotator 350. For the example architecture 300 of FIG. 3, the counter would therefore be set to 3, i.e., 4-1, in response to the initiate signal 305. The counter 315 is configured to decrement each time the rotator 350 receives a different vector of elements of the input matrix, that is, to decrement for each diagonal of elements of the input matrix processed by the rotator 350. The counter 315 is further configured to reset to N-1 after the rotator 350 has performed a rotation by 0 positions on a set of elements. Alternatively, the rotator 350 may be configured to determine when the counter 315 specifies a rotation by 0 positions on a set of elements, and in response may pass the values through the rotator 350 without performing a rotation operation.

Thus, for the transpose unit 300 of FIG. 3, the counter 315 would cause the rotator 350 to rotate a first diagonal of elements of an input matrix by 3 positions, a second diagonal of elements of an input matrix by 2 positions, a third diagonal of elements of an input matrix by 1 position, a fourth diagonal of elements of an input matrix by 0 positions, and then repeat this process for subsequent diagonals of elements of the input matrix, starting with rotation of a fifth diagonal of elements of the input matrix by 3 positions. In effect, this rotation shifts the position of the elements in the second vector received from the reverser 340, which represent a reflection of elements of a diagonal of the input matrix across a main diagonal, into the appropriate positions to allow the elements to be written as elements of a transpose output matrix.

While described above as performing right-rotation, in some implementations the rotator 350 performs left-rotation. In such implementations, the counter may be initially set to 1 in response to the initiate signal 305, increment for each set of elements processed by the rotator 350 until the rotator 350 rotates a set of elements by N-1 positions, and then be reset to 0 after the rotation of elements by N-1 positions has been performed.

The elements stored at the register of the rotator 350 may be accessed by value outputs 360, which then provide the elements to the staggered memory writer 370 for writing into memory, e.g., into the memory 208. For instance, after writing rotated elements into the register of the rotator 350 as a third vector, each of the value outputs 360 may access a corresponding element of the register of the rotator 350. For example, the value output [0] 360 may access an element in the [0] position of the register of the rotator 350, the value output [1] 360 may access an element in the [1] position of the register of the rotator 350, and so forth.

The staggered memory writer 370 receives the elements from the value outputs 360 and appropriately writes the elements into memory such that the memory stores an output matrix that is a transpose of the input matrix. For example, using similar techniques as those described subsequently for the staggered memory reader 310, the staggered memory writer 370 can store the elements in the memory 208 such that the transpose output matrix is properly formatted. The transpose output matrix stored in the memory 208 can be returned as the result of a function computed by the special-purpose hardware circuit 200 that includes the transpose unit, or can be further processed within the special-purpose hardware circuit 200 to generate a result that may be returned by the matrix-vector processing system 100 in response to a request.

In some implementations, the number of elements that can be received by the input register 330, reverser 340, and rotator 350 may be the same, i.e., the input register 330, reverser 340, and rotator 350 may all have the same width. In other implementations, one or more of the input register 330, reverser 340, or rotator 350 may be capable of receiving a different number of elements and of storing those elements as a vector, e.g., in a register. In some implementations, the value loaders 320 or value outputs 360 may be optional components of the transpose unit architecture 300, for example, where the staggered memory reader 310 can write data directly to the input register 330 or where the rotator 350 can send data directly to the staggered memory writer 370.

In some implementations, the transpose unit 300 may compute a transpose of an input matrix that is larger than the maximum dimensioned matrix that the transpose unit 300 can transpose. Because transpose is a recursive computation, the transpose of a larger matrix may be obtained by dividing the matrix into a set of smaller matrices, transposing the smaller matrices individually, and tiling the smaller transpose matrices to generate the transpose of the larger matrix. For example, the 4×4 transpose unit 300 may compute the transpose of a 16×16 input matrix by decomposing the 16×16 matrix into four 4×4 matrices, computing the transpose of each of the four 4×4 matrices, and tiling the four 4×4 transpose matrices to obtain the transpose of the 16×16 input matrix.

In some implementations, computing the transpose of an input matrix that is larger than the maximum dimensioned matrix that the transpose unit 300 can transpose requires processing of the input matrix by components external to the transpose unit 300. For example, the matrix-vector processing engine 150 of FIG. 1 may determine that an input matrix has dimensions exceeding those the transpose unit 300 can process, and so may identify or generate submatrices of the input matrix that can be provided to and processed by the transpose unit 300 individually. The matrix-vector processing engine 150 may receive the transposes of the submatrices and tile the transposes of the submatrices to obtain the transpose of the input matrix. In some implementations, the transpose unit 300 or other components of the special-purpose hardware circuit 110 may be capable of decomposing an input matrix and/or tiling the transposes of the submatrices in hardware to generate a transpose of an input matrix. For example, control signals received by the special-purpose hardware circuit may specify specific memory locations, e.g., in a split array, to store the transposes of the submatrices.

Figure 4:
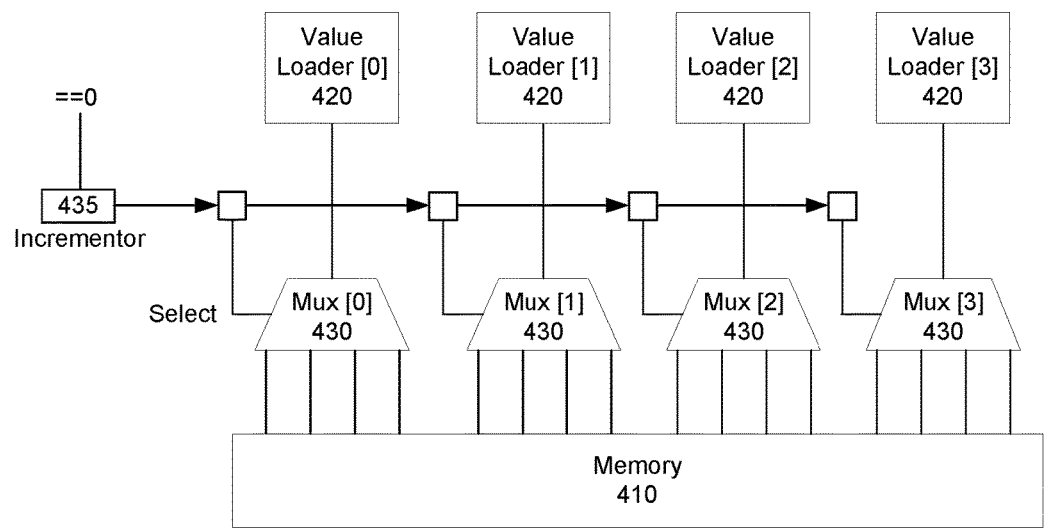
FIG. 4 shows an example architecture of a staggered memory write unit in a matrix-vector processing system.

FIG. 4 shows an example architecture of a staggered memory reader 400. The staggered memory reader 400 accesses elements of diagonals of an input matrix, and provides those elements to other components of a transpose unit, e.g., the transpose unit 300 of FIG. 3, to compute a matrix or vector transpose. The staggered memory reader 400 can access a memory 430, such as the memory 208, where an input matrix or vector has been stored. For example, as a part of processing a request to compute a matrix transpose or a function that requires a matrix transpose, the input matrix or vector may be stored at the memory 430 and may be accessed by the staggered memory reader 400 to compute a transpose of the input matrix.

The staggered memory reader 400 includes multiplexors (Mux) 430. In some implementations, the number of multiplexors 430 included in the staggered memory reader 400 is equivalent to the number of elements that can be received by the reverser 340 of FIG. 3. In some implementations, this number of multiplexors is also equivalent to the number of elements that can be received by the rotator 350, i.e., when the reverser 340 and rotator 350 have the same width. In those instances, the number of multiplexors is generally equivalent to a maximum dimension matrix that the transpose unit can process. Thus, the example staggered memory reader 400 shown in FIG. 4 may be used in a transpose unit that is capable of transposing matrices up to a size of 4×4. In other examples, the staggered memory reader 400 may have a greater number of multiplexors 430, i.e., have a greater width, than the reverser 340 or rotator 350.

Each of the multiplexors 430 may be an N-to-1 multiplexor, where N is equivalent to a number of elements that can be received by the rotator 350 of FIG. 3. For example, the multiplexors 430 are 4-to-1 multiplexors as shown in FIG. 4, to be used in a transpose unit capable of performing transposes on matrices of up to size 4×4, such that the rotator 350 of the transpose unit would also have a width of 4. Where an input matrix is of the maximum size that can be processed by the transpose unit, the respective inputs of the multiplexors 430 will each correspond to a row of the input matrix, i.e., the $0^{th}$ input of each multiplexor 430 corresponds to the $0^{th}$ row of the input matrix, the $1^{st}$ input of each multiplexor 430 corresponds to a $1^{st}$ row of the input matrix, etc. Additionally, each of the multiplexors 430 corresponds to a column of the input matrix, up to the multiplexor 430 corresponding to the largest dimension of input matrix that the transpose unit can process. That is, where an input matrix is of the maximum size that can be processed by the transpose unit, multiplexor [0] will correspond to the $0^{th}$ row of the input matrix, multiplexor [1] will correspond to the $1^{st}$ row of the input matrix, etc.

Thus, the multiplexors 430 enable access to each element of the input matrix up to the largest dimension matrix that can be processed by the transpose unit. For example, a $0^{th}$ input of multiplexor [2] provides access to a (0,2) element of an input matrix, a $3^{rd}$ input of multiplexor [3] provides access to a (3,3) element of an input matrix, etc. To enable a staggered memory read, the staggered memory reader 400 includes an incrementor 435 that provides a control signal to each of the multiplexors 430. The incrementor 435 increments a control signal that is propagated to each of the multiplexors 430 in a staggered fashion. For the example architecture 400 of FIG. 4, the incrementor 435 initially receives a value of 0 and provides that control signal as a select signal for multiplexor [0]. In a next iteration, the value of 0 is incremented to 1, and is provided as a select signal for multiplexor [0]. The control signal with a value of 0 is propagated to multiplexor [1]. The control signal continues to propagate in this manner until the select signal at multiplexor [3] has a value of 3, i.e., to select the (3,3) element of the input matrix. The pattern of select signals provided to each multiplexor 430 therefore effectively specifies the order that diagonals of an input matrix are read for processing by the transpose unit, and is given in table 450.

As shown in the table 450, at cycle 0, a first diagonal of a 4×4 input matrix, i.e., the (0,0) element of the input matrix, is read by the staggered memory reader 400 and provided to the value loaders 420. At cycle 1, elements (1,0) and (0,1), corresponding to a second diagonal of the 4×4 input matrix, are provided to the value loaders 420. At cycle 2, elements (2,0), (1,1), and (0,2) of a third diagonal of the input matrix are provided to the value loaders 420. This process continues as shown according to the table 450 until all of the elements of the 4×4 input matrix have been read from the memory 430 in a staggered manner and provided to the value loaders 420. The value loaders 420 can receive the elements output by the multiplexors 430 and provide those elements to the input register 330 of FIG. 3 at each cycle. As shown in table 450, for many cycles one or more of the value loaders 420 may not receive an element corresponding to an element of the input matrix. For these unused value loaders 420, the data received by them from the corresponding multiplexors 430 or output by them to the input register 330 can be ignored. Additionally or alternatively, the value loaders 420 may be configured to forgo outputting data to the input register 330 when their inputs do not correspond to elements of an input matrix.

In some implementations, two control signals may be used to enable the transpose unit to compute multiple transposes simultaneously. For example, a 4×4 transpose unit may compute two 2×2, 3×2, or 4×2 transposes simultaneously if a first control signal is provided to a first two of the multiplexors 430, e.g., multiplexors [0] and [1], and a second control signal is provided to a second two of the multiplexors 430, e.g., multiplexors [2] and [3]. Each control signal can use the same propagation scheme discussed above, to enable the 4×4 transpose unit to compute the transpose of two 2×2, 3×2, or 4×2 transposes using the same number of cycles as it would require to compute a single one of the 2×2, 3×2, or 4×2 matrix transposes.

In some implementations, the staggered memory reader 400 is capable of supporting "bubbles," i.e., erroneous gaps in memory or in a stream of data corresponding to an input matrix. To handle these errors, each of the multiplexors 430 may include a load enable input. The multiplexors 430 may be configured such that the load enable indicates whether a "bubble" has occurred, such that if a "bubble" does occur the multiplexors 430 do not read the memory and the transpose process effectively stalls until the error passes. The load enable may be configured to respond automatically to a "bubble," and after the "bubble" passes, to automatically switch to resume the transpose process. The load enable signal may be configured to allow the staggered memory reader 400 to support "bubbles" that occur in every lane simultaneously, i.e., at each of the multiplexors 430 at once, or may be configured to allow the staggered memory reader 400 to support "bubbles" that occur in select lanes, e.g., each multiplexor 430 may be controlled by a separate load enable signal or a load enable signal shared by a subset of the multiplexors 430.

In some implementations, a staggered memory writer, such as the staggered memory writer 370 of FIG. 3, operates according to similar principles. For example, a staggered memory writer may comprise N multiplexors, where N is the number of elements capable of being received by the rotator 350, i.e., the number of value outputs 360. Each multiplexor may be a 1-to-N multiplexor and may receive an element from a value output, e.g., the value outputs 360 of FIG. 3, at its input. A control signal similar to that discussed above with respect to the staggered memory reader 400 is provided as a select signal to each multiplexor of the staggered memory writer. The control signal for controlling the staggered memory writer may be provided by an incrementor similar to the incrementor 435 of the staggered memory reader 400, and staggered to provide a select signal to multiplexors of the staggered memory writer similarly to the staggered memory reader 400. The multiplexors therefore write to a memory, e.g., the memory 208, in a staggered fashion according to the same pattern discussed above and shown at table 450. That is, at cycle 0, the staggered memory writer stores an element in memory corresponding to a (0,0) position of the transpose output matrix, at cycle 1 stores elements in memory corresponding to (1,0) and (0,1) positions of the transpose output matrix, etc.

Figure 5:
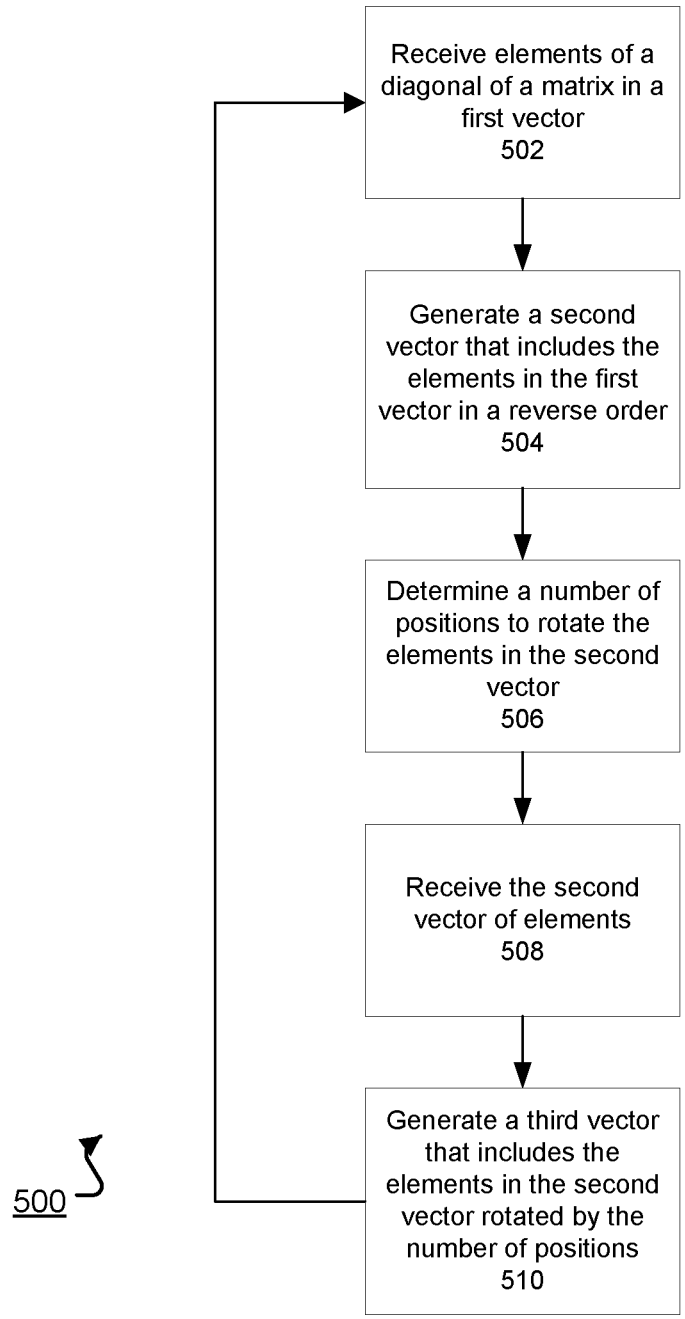
FIG. 5 is a flow diagram of an example method for transposing a matrix using a matrix-vector processing system.

FIG. 5 is a flowchart of an example process 500 for performing a matrix transpose computation. Generally, the process 500 is performed by a system of one or more computers that includes a special-purpose hardware circuit, for example, the special-purpose hardware circuit 110 of FIG. 1 that includes a transpose unit 120.

The system receives elements of a diagonal of a matrix in a first vector (502). For example, reversal circuitry of a transpose unit, e.g., the reverser 340 of FIG. 3, can receive the elements of a diagonal of an input matrix. The elements of the diagonal of the input matrix can be received by the reversal circuitry from, e.g., an input register 330 or value loaders 320 as discussed with respect to FIG. 3. The elements of the diagonal may have been obtained from an input matrix stored in memory, e.g., a static random-access memory (SRAM), by a staggered memory reader, e.g., the staggered memory reader 400 of FIG. 4. The reversal circuitry can receive the elements of the diagonal in a register of the reversal circuitry.

The system generates a second vector that includes the elements of the diagonal of the matrix in an order that is a reverse of an order of the elements of the diagonal of the matrix in the first vector (504). The reversal circuitry of the transpose unit can store the elements of the diagonal of the matrix in the first vector in a register in an order that is a reverse of the order of those elements in the first vector. For example, the reverser 340 of FIG. 3 may store the elements of the diagonal of the input matrix received from the input register 330 or value loaders 320 in a register of the reverser 340 in an order that is a reverse of the order in which those elements are stored in the input register 330.

The system determines a number of positions by which to rotate the elements of the diagonal of the matrix in the second vector (506). For example, rotation circuitry of the transpose unit, e.g., the rotator 350 of FIG. 3, can determine a number of positions by which to rotate the elements of the diagonal of the matrix in the second vector. In some implementations, the rotation circuitry may determine the number of positions by which to rotate the elements in the second matrix based on a counter that controls or is accessible by the rotation circuitry, e.g., the counter 315 of FIG. 3.

In some implementations, the counter may be initialized to a value of N−1, where N is equivalent to a number of elements that the rotation circuitry can receive, i.e., a width of the register of the rotation circuitry. The counter may be initialized in response to an initiate signal, such as a control signal triggering the special-purpose hardware circuit to perform operations to compute a transpose. The counter may decrement for each cycle in which the rotation circuitry receives a second vector of elements of a diagonal of the input matrix.

After the number of positions by which the rotation circuitry rotates a second vector of elements is zero, i.e., after a cycle in which the rotation circuitry does not rotate the elements of a second vector, the counter may be reset to the initialized value. In this manner, the rotation circuitry can determine a number of positions by which to rotate the elements in a second vector using a counter that requires only a single initiate control signal to output a correct number of positions by which to rotate the elements in the second vector for each of the cycles required to perform a full transpose computation.

The system receives the second vector of elements of the diagonal of the matrix (508). For example, the rotation circuitry of the system can receive the second vector of elements generated by the reversal circuitry. In some implementations, the rotation circuitry, e.g., the rotator 350 of FIG. 3, receives the second vector of elements generated by the reversal circuitry, e.g., the reverser 340 of FIG. 3, by accessing a register of the reversal circuitry that holds the elements of the second vector, and by storing the elements of the second vector in a register of the rotation circuitry. In other implementations, the rotation circuitry may access the second vector stored at a register of the reversal circuitry without storing the second vector of elements of the matrix at a register of the rotation circuitry.

The system generates a third vector that includes the elements of the diagonal of the matrix in the second vector in an order that is a rotation of the elements of the diagonal of the matrix in the second vector by the determined number of positions (510). For example, rotation circuitry of the special-purpose hardware circuit, e.g., the rotator 350 of FIG. 3, may store the order of the elements of the received second vector in a register of the rotation circuitry in the rotated order such that the order of the elements in the register of the rotation circuitry reflects the determined number of positions by which to rotate the elements of the received second vector. In some implementations, the rotation circuitry may perform a right-rotation of the elements of the second vector in generating the third vector. For example, right-rotation is performed to rotate the elements of the second vector by the number of positions determined as described above with reference to step 508, i.e., based on a number of positions specified by the counter. The rotation circuitry can store the right-rotated elements in the register of the rotation circuitry.

After generating the third vector of elements of the diagonal of the matrix, the elements of the third vector may be stored at a memory, e.g., the memory 208. The elements of the third vector may be stored at the memory using a staggered memory writer, e.g., as discussed at FIGS. 3 and 4, to write the elements of the third vector stored at the register of the rotation circuitry to proper locations of the memory, effectively storing a diagonal of the transpose of the input matrix.

The process 500 may be repeated for each of the diagonals of an input matrix. For example, for a matrix of dimensions m×n, (m+n)−1 iterations of the process 500 will be performed for the system to output the full transpose of the input matrix.

Figure 6A:
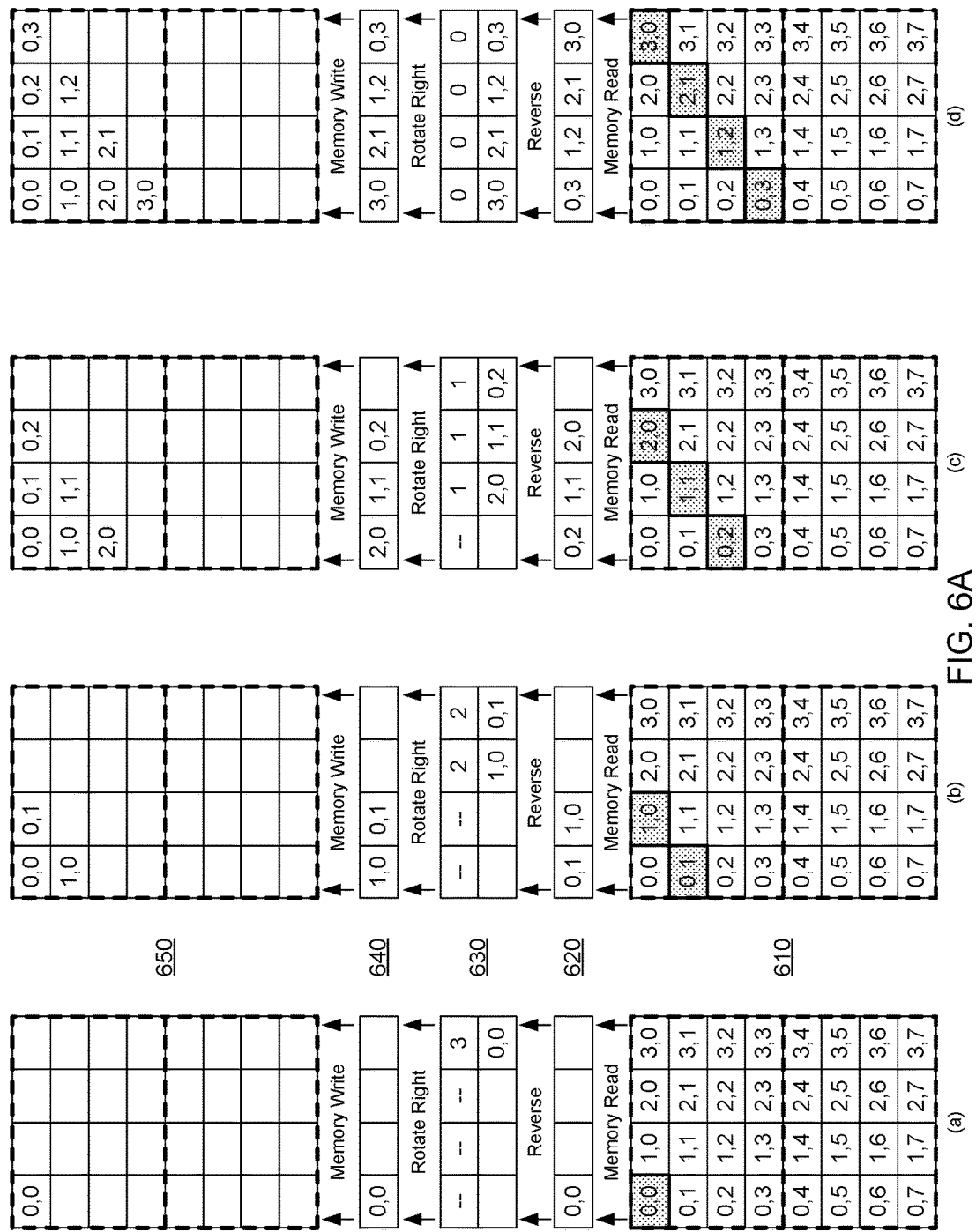
FIGS. 6A-6C show an example for transposing a matrix in a matrix-vector processor.
Figure 6B:
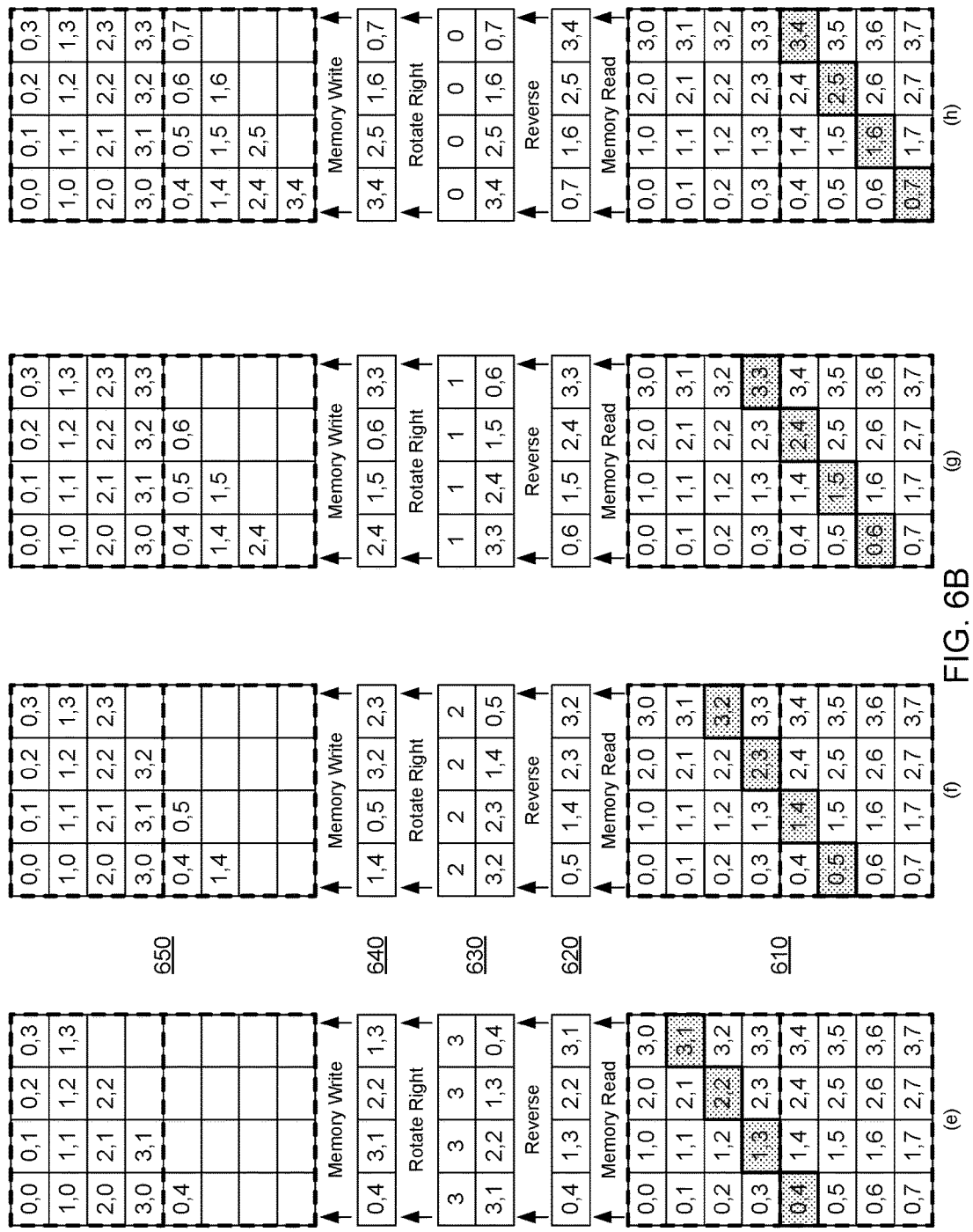
Figure 6C:
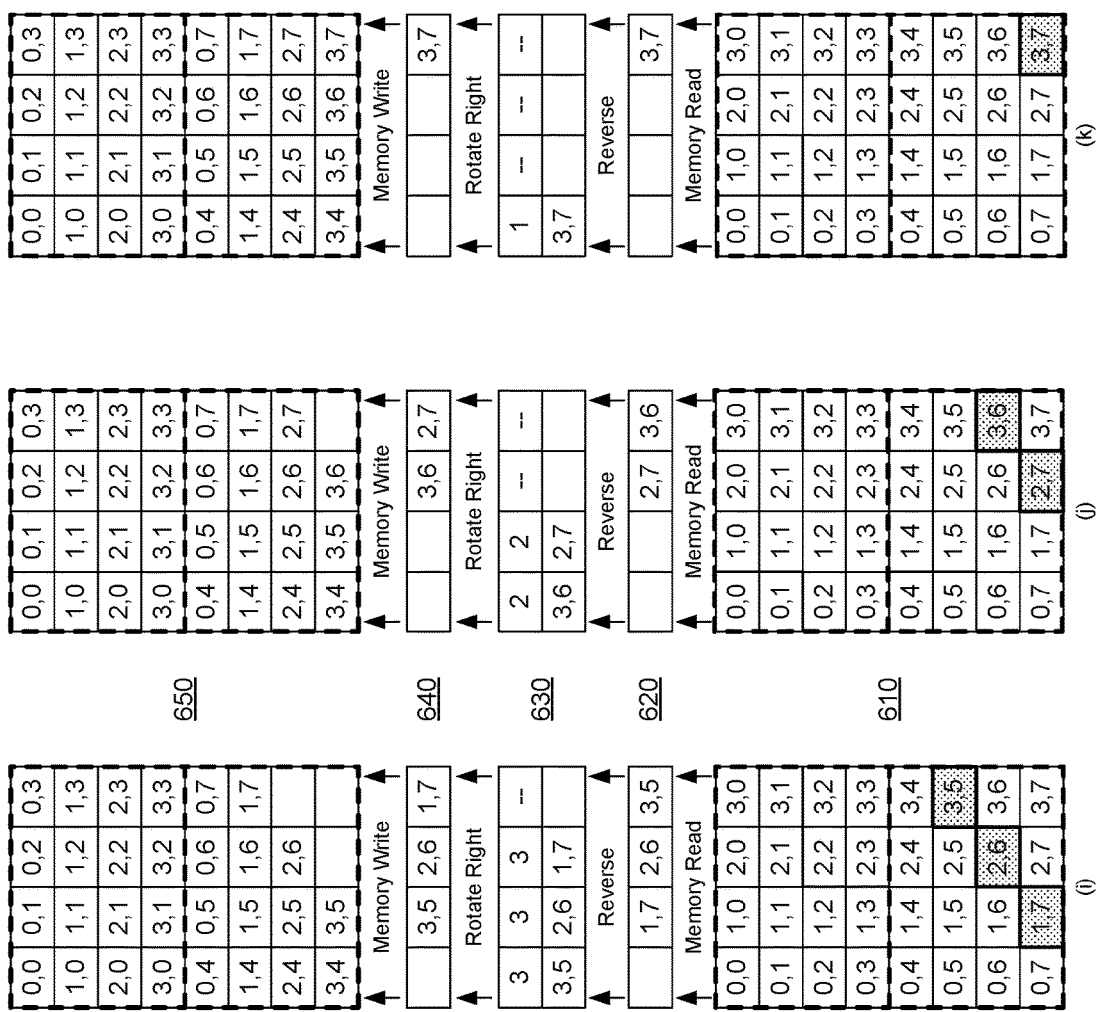

FIGS. 6A-6C show an example of transposing a matrix in a matrix-vector processor. In some implementations, the example of FIGS. 6A-6C may be performed by the matrix-vector processing system 100 of FIG. 1 that features the special-purpose hardware circuit 110 including the transpose unit 120. Specifically, FIGS. 6A-6C illustrate an example in which the matrix-vector processing system 100 can compute multiple matrix transposes sequentially, such that a second matrix transpose may begin while a first matrix transpose computation is ongoing. The ability to perform sequential transpose operations with an overlap increases the efficiency of the matrix-vector processing system 100 in performing matrix transpose computations.

In each of the cycles of the example shown at FIGS. 6A-6C, a memory 610, e.g., a static random-access memory (SRAM) which may be used to implement the memory 208, may be accessed by a staggered memory read circuit, e.g., the staggered memory reader 400 of FIG. 4, and data from the memory 610 placed in an input register 620, e.g., similar to the input register 330 of FIG. 3. A reversal circuit, e.g., the reverser 340 of FIG. 3, may reverse the values in the input register 620 and place the reversed values in a register of a rotation circuit 630, e.g., a register of the rotator 350 of FIG. 3. The rotation circuit 630 rotates the values in the register of the rotation circuit 630 by a determined number of positions, e.g., by determining the number of positions from a counter similar to counter 315 of FIG. 3. A result of performing the rotation is placed in a register of a staggered memory write circuit 640, e.g., a register of the staggered memory writer 370 or, optionally, the value outputs 360 of FIG. 3. Staggered memory writing of the values in the register of the staggered memory write circuit 640 is performed to store the values in the appropriate locations of a memory 650, e.g., a static random-access memory (SRAM) that may be used to implement the memory 208.

Briefly, at cycle (a) shown at FIG. 6A, a first value (0,0) corresponding to a first diagonal of a first input matrix is received and is processed according to the described methods, e.g., the method 500 of FIG. 5, to store the value in a first location of the memory 650. At cycle (b), values of a second diagonal of the first input matrix are received and manipulated to store the values in the appropriate locations of the memory 650. A similar process is repeated for cycles (c) and (d) to store the values of the third and fourth diagonals of the first input matrix at the memory 650, such that the first input matrix is properly transposed, i.e., reflected across its main diagonal.

At cycle (e) shown at FIG. 6B, a fifth diagonal of the first input matrix is manipulated and stored in the memory 650, and the cycle also captures element (0,4) corresponding to a first diagonal of a second input matrix, which is stored at an appropriate location in the memory 650. Thus, at cycle (e), the second matrix transpose computation is begun without a requirement for additional computing power by the transpose unit. Cycles (f) and (g) show the completion of the computation of the transpose of the first input matrix, which at cycle (g) is completely stored in the memory 650 and is a proper transpose of the first input matrix.

These same cycles also accomplish the processing of the second and third diagonals of the second input matrix.

Cycle (h), shown at FIG. 6B, and cycles (i), (j), and (k), shown at FIG. 6C, process the remaining four diagonals of the second input matrix, and result in the storage of the transpose of the second input matrix in the memory 650. Thus, the example of FIGS. 6A-6C shows that multiple input matrices can be processed by the transpose unit sequentially and with overlap to reduce the computing costs of performing multiple matrix transpose computations. While shown in FIGS. 6A-6C as being performed sequentially without a delay, in other implementations the gap between two input matrices may be of an arbitrary duration. In those instances, the transpose unit would still properly compute transposes of the input matrices, with the data output by the transpose unit during the gap between the input matrices being data that can be ignored or discarded.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a standalone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To send for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can send input to the computer. Other kinds of devices can be used to send for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A circuit for transposing a matrix, the circuit comprising:
   reversal circuitry configured to:
      receive, for each of one or more diagonals of the matrix, elements of the diagonal of the matrix in a respective first vector, and
      generate, for each of the one or more diagonals of the matrix, a respective second vector that includes the elements of the diagonal of the matrix in the respective first vector in an order that is a reverse of an order of the elements of the diagonal of the matrix in the respective first vector;
   counter circuitry configured to:
      receive an initiate signal indicative of a direction of rotation of the respective second vector; and responsive to receiving the initiate signal, generate a counter signal based on the direction of the rotation of the respective second vector; and rotation circuitry comprising bit-wise shifting circuit elements comprising combinatorial logic, the rotation circuitry configured to:

receive the counter signal from the counter circuitry, determine, for each of the one or more diagonals of the matrix and based at least on the counter signal, a number of positions by which to rotate the elements of the diagonal of the matrix in the respective second vector, receive, at the bit-wise shifting circuit elements, for each of the one or more diagonals of the matrix, the respective second vector of elements of the diagonal of the matrix from the reversal circuitry, and generate, by the combinatorial logic of the bit-wise shifting circuit elements, for each of the one or more diagonals of the matrix, a respective third vector that includes the elements of the diagonal of the matrix in the respective second vector in an order that is a rotation of the elements of the diagonal of the matrix in the respective second vector by the number of positions determined based at least on the counter signal.

2. The circuit of claim 1, wherein the rotation circuit comprises the counter circuitry configured to generate the counter signal.

3. The circuit of claim 1, wherein the counter circuitry is configured to:

receive the initiate signal that is indicative of a left-rotation direction, and in response to the initiate signal that is indicative of a left-rotation direction, set the counter signal to correspond to an initial value equivalent to N−1, where N is equivalent to the width of the rotation circuitry.

4. The circuit of claim 3, wherein the counter circuitry is configured to adjust the counter signal for each of the one or more diagonals of the matrix, wherein adjusting the counter signal comprises:

when the counter signal corresponds to a positive value, adjust the counter signal to decrement the corresponding value; and when the counter signal corresponds to a value of zero, reset the counter signal so that the counter signal corresponds to the initial value.

5. The circuit of claim 1, wherein the matrix is a submatrix of a second matrix.

6. The circuit of claim 1, comprising staggered memory read circuitry configured to:

access, for each of the one or more diagonals of the matrix, elements of the diagonals of the matrix; and output, to the reversal circuitry, the elements of the diagonal of the matrix as the respective first vector.

7. The circuit of claim 6, wherein the staggered memory read circuitry comprises M multiplexors, where M is equivalent to the width of the reversal circuitry, and wherein each of the M multiplexors is configured to output one of a plurality of elements of a column of the matrix.

8. The circuit of claim 7, wherein the staggered memory read circuitry is configured to receive a control signal that specifies, for each of the M multiplexors, an input of the multiplexor to provide as an output of the multiplexor.

9. The circuit of claim 7, wherein each of the M multiplexors is an N-to-1 multiplexor, wherein N is the number of elements capable of being received by the rotation circuitry.

10. The circuit of claim 7, wherein the staggered memory read circuitry is configured to:

receive a first control signal that specifies, for a first one or more of the M multiplexors, an input of the multiplexor to provide as an output of the multiplexor; and receive a second control signal that specifies, for a second one or more of the M multiplexors, an input of the multiplexor to provide as an output of the multiplexor.

11. The circuit of claim 1, comprising:

staggered memory write circuitry configured to write, for each of the one or more diagonals of the matrix, the elements of the diagonal of the matrix in the respective third vector to memory as a diagonal of a transpose output matrix.

12. The circuit of claim 11, wherein:

the rotation circuitry comprises a register configured to receive, for each of the one or more diagonals of the matrix, the respective third vector; and the staggered memory write circuitry is configured to access, for each of the one or more diagonals of the matrix, the elements of the diagonal of the matrix in the respective third vector at the register.

13. The circuit of claim 1, wherein the matrix comprises two or more matrices stored in a memory as a single matrix.

14. The circuit of claim 1, wherein the rotation circuitry is configured to perform right rotation of the elements of the diagonal of the matrix in the respective second vector by the determined number of positions to generate the respective third vector.

15. The circuit of claim 1, wherein the matrix is stored at a static random-access memory accessible by the circuit.

16. The circuit of claim 1, wherein, for each of the one or more diagonals of the matrix, the elements of the diagonal of the matrix in the respective third vector are stored in a static random-access memory as a diagonal of a transpose output matrix.

17. The circuit of claim 16, comprising:

second counter circuitry configured to:

generate the second counter signal; and transmit the second counter signal to the rotation circuitry.

18. The circuit of claim 1, comprising second rotation circuitry configured to:

determine, for each of one or more diagonals of a second matrix and based at least on a second counter signal, a second number of positions by which to rotate elements of the diagonal of the second matrix;

receive, for each of the one or more diagonals of the second matrix, a respective fourth vector that includes elements of the diagonal of the second matrix; and generate, for each of the one or more diagonals of the second matrix, a respective fifth vector that includes the elements of the diagonal of the second matrix in the respective fourth vector in an order that is a rotation of the elements of the diagonal of the second matrix in the respective fourth vector by the determined second number of positions determined based at least on the second counter signal.

19. The circuit of claim 1, wherein the counter circuitry is configured to:

receive the initiate signal that is indicative of a right-rotation direction, in response to the initiate signal that is indicative of a right-rotation direction, set the counter signal to correspond to an initial value equivalent to 0, and adjust the counter signal for each of the one or more diagonals of the matrix, wherein adjusting the counter signal comprises:
when the counter signal corresponds to a value equivalent to N−1, where N is equivalent to the width of the rotation circuitry, reset the counter signal so that the counter signal corresponds to the initial value, and
when the counter signal corresponds to a value less than N−1, adjust the counter signal to increment the corresponding value.

20. A circuit for transposing an input vector, the circuit comprising:
reversal circuitry configured to:
receive a first vector that includes the elements of the input vector, and
generate a second vector that includes the elements of the first vector in an order that is a reverse of an order of the elements in the first vector;
counter circuitry configured to:
receive an initiate signal indicative of a direction of rotation of the second vector; and
responsive to receiving the initiate signal, generate a counter signal based on the direction of the rotation of the second vector; and
rotation circuitry comprising bit-wise shifting circuit elements comprising combinatorial logic, the rotation circuitry configured to:
receive the counter signal from the counter circuitry,
determine a number of positions by which to rotate the elements in the second vector based at least on the counter signal,
receive, at the bit-wise shifting circuit elements, the second vector of elements, and
generate, by the combinatorial logic of the bit-wise shifting circuit elements, a third vector that includes the elements of the second vector in an order that is a rotation of the order of the elements in the second vector by the number of positions determined based at least on the counter signal.

* * * * *